(12) United States Patent
Mun (10) Patent No.: US 12,374,400 B2
(45) Date of Patent: Jul. 29, 2025

(54) MEMORY DEVICE CONTROLLING PASS VOLTAGE AND OPERATING METHOD THEREOF

(71) Applicant: SK hynix Inc., Icheon-si (KR)

(72) Inventor: Yeong Jo Mun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 82 days.

(21) Appl. No.: 18/365,812

(22) Filed: Aug. 4, 2023

(65) Prior Publication Data

US 2024/0265971 A1    Aug. 8, 2024

(30) Foreign Application Priority Data

Feb. 8, 2023    (KR) ........................ 10-2023-0016889

(51) Int. Cl.
| | |
|---|---|
| G11C 16/08 | (2006.01) |
| G11C 16/04 | (2006.01) |
| G11C 16/10 | (2006.01) |
| G11C 16/26 | (2006.01) |
| G11C 16/32 | (2006.01) |

(52) U.S. Cl.
CPC .......... *G11C 16/08* (2013.01); *G11C 16/0483* (2013.01); *G11C 16/10* (2013.01); *G11C 16/26* (2013.01); *G11C 16/32* (2013.01)

(58) Field of Classification Search
CPC .................................................... G11C 16/32
See application file for complete search history.

(56) References Cited

U.S. PATENT DOCUMENTS

| | | | | |
|---|---|---|---|---|
| 5,608,671 | A * | 3/1997 | Ninomiya .............. | G11C 16/16 365/185.29 |
| 2002/0139999 | A1* | 10/2002 | Hirano .................... | G11C 16/16 257/200 |
| 2006/0107124 | A1* | 5/2006 | Yagi ...................... | G11B 19/047 714/50 |
| 2009/0303790 | A1* | 12/2009 | Fujimura ............... | G11C 16/16 365/185.29 |
| 2010/0124111 | A1* | 5/2010 | Suzuki ............... | G11C 16/0483 365/185.11 |
| 2020/0381063 | A1 | 12/2020 | Kavalipurapu et al. | |

FOREIGN PATENT DOCUMENTS

| | | |
|---|---|---|
| KR | 101030617 B1 | 4/2011 |
| KR | 1020140053009 A | 5/2014 |

\* cited by examiner

*Primary Examiner* — Douglas King
(74) *Attorney, Agent, or Firm* — WILLIAM PARK & ASSOCIATES LTD.

(57) ABSTRACT

A memory device includes: a memory cell array including a cell string including a plurality of memory cells respectively connected between a common source line and a plurality of bit lines; a peripheral circuit for performing an internal operation on the memory cells; and control logic for controlling the peripheral circuit to apply a voltage necessary for the internal operation to word lines connected to the plurality of memory cells. The peripheral circuit includes a pass voltage information generator for generating pass voltage information including a number of clocks input from a time at which a pass voltage is applied to the word lines to a time at which a voltage level of the common source line reaches a predetermined reference level. The control logic includes a pass voltage determiner for determining a pass voltage to be applied to the word lines, based on the pass voltage information.

15 Claims, 9 Drawing Sheets

MEMORY DEVICE CONTROLLING PASS VOLTAGE AND OPERATING METHOD THEREOF

CROSS-REFERENCE TO RELATED APPLICATION

The present application claims priority under 35 U.S.C. § 119(a) to Korean patent application number 10-2023-0016889 filed on Feb. 8, 2023, in the Korean Intellectual Property Office, the entire disclosure of which is incorporated by reference herein.

BACKGROUND

1. Technical Field

The present disclosure generally relates to an electronic device, and more particularly, to a memory device controlling a pass voltage and an operating method thereof.

2. Related Art

A NAND flash memory device among nonvolatile memory devices stores electrons in a floating gate, thereby storing data. An operation of reading data stored in NAND flash memory is performed in units of pages. When a read operation is performed on data stored in the NAND flash memory, a threshold voltage of memory cells is read by applying a read voltage to a selected word line to be read and applying a pass voltage to an unselected word line. However, a retention phenomenon in which electrons stored in the floating gate are leaked may occur in the NAND flash memory, and therefore, a disturb phenomenon may occur when an excessive pass voltage is applied.

SUMMARY

Some embodiments are directed to a memory device controlling a pass voltage and an operating method thereof.

In accordance with an embodiment of the present disclosure, a memory device includes: a memory cell array including a cell string including a plurality of memory cells respectively connected between a common source line and a plurality of bit lines; a peripheral circuit configured to perform an internal operation on the memory cells; and control logic configured to control the peripheral circuit to apply a voltage necessary for the internal operation to word lines connected to the plurality of memory cells. The peripheral circuit includes a pass voltage information generator configured to generate pass voltage information including a number of clocks input from a time at which a pass voltage is applied to the word lines to a time at which a voltage level of the common source line reaches a predetermined reference level. The control logic includes a pass voltage determiner configured to determine a pass voltage to be applied to the word lines, based on the pass voltage information.

In accordance with another embodiment of the present disclosure, a method of operating a memory device includes: applying a pass voltage to a plurality of word lines; monitoring a voltage level of a common source line; counting a number of clocks input from a time at which the pass voltage is applied to the plurality of word lines to a time at which the voltage level of the common source line reaches a predetermined reference level; and determining a pass voltage to be applied to the plurality of word lines, based on the counted number of clocks.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as being limited to the embodiments set forth herein.

Figure 1:
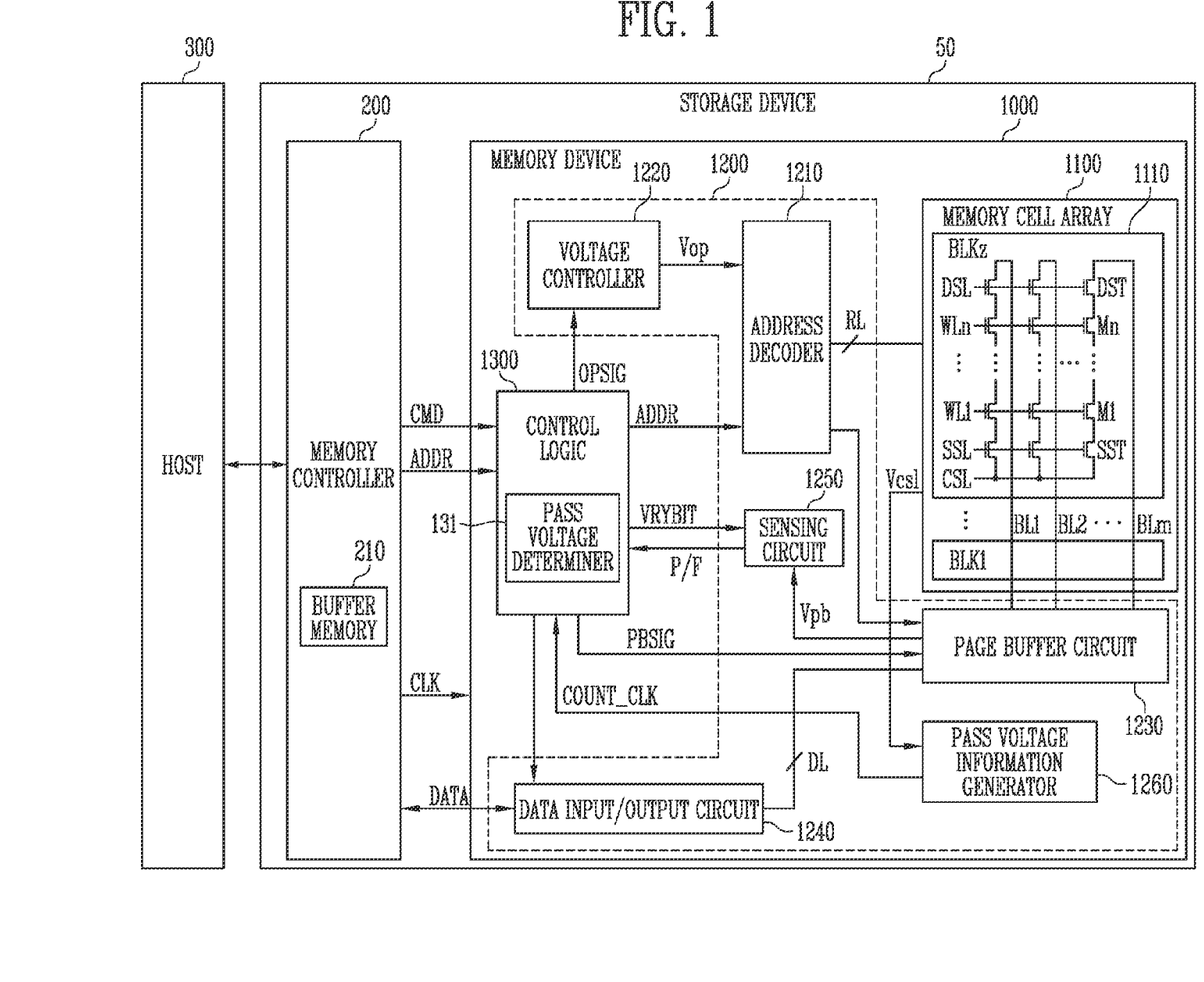
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory controller 200 and a memory device 1000. The storage device 50 may be a device which is included in a mobile phone, a computer, an in-vehicle infotainment system, or the like, and stores data under the control of a host 300 as an external device.

In an embodiment, the storage device 50 may be manufactured as any one of various types of storage devices according to a host interface as a communication scheme with the host 300. In an embodiment, the storage device 50 may be manufactured as any one of various kinds of package types.

The memory device 1000 may store data. The memory device 1000 may be operated under the control of the memory controller 200. The memory device 1000 may be a volatile memory device or a nonvolatile memory device.

The memory device 1000 may receive a command CMD and an address ADDR from the memory controller 200, and access an area selected by the address ADDR. The memory device 1000 may perform a program operation of storing data in the area selected by the address ADDR, a read operation of reading data, or an erase operation of erasing data under the control of the memory controller 200.

The memory controller 200 may control overall operations of the memory device 1000.

When power is applied to the storage device 50, the memory controller 200 may execute firmware (FW). The memory controller 200 may control communication between the host 300 and the memory device 1000 by executing the FW.

The memory controller 200 may control the memory device 1000 to perform a program operation, a read operation, an erase operation, or the like in response to a request from the host 300. The memory controller 200 may provide the memory device 1000 with a command CMD, an address ADDR, or data DATA in response to the request of the host 300.

The memory controller 200 may autonomously generate a command, an address, and data, regardless of any request from the host 300, and transmit the command, the address, and the data to the memory device 1000. For example, the memory controller 200 may provide the memory device 1000 with a command, an address, and data, which are used to perform read and program operations accompanied in performing wear leveling, read reclaim, garbage collection, and the like.

The host 300 may communicate with the storage device 50 by using at least one of various communication schemes.

The memory device 1000 may include a memory cell array 1100, a peripheral circuit 1200, and control logic 1300.

The memory cell array 1100 may include a plurality of memory blocks BLK1 to BLKz. The plurality of memory blocks BLK1 to BLKz may be connected to an address decoder 1210 through row lines RL. The plurality of memory blocks BLK1 to BLKz may be connected to a page buffer circuit 1230 through bit lines BL1 to BLm. Each of the plurality of memory blocks BLK1 to BLKz may include a plurality of memory cells.

Referring to FIG. 1, an arbitrary memory block BLKz may be connected to a plurality of word lines arranged in parallel to each other between a first select line and a second select line. The first select line may be a source select line SSL, and the second select line may be a drain select line DSL. More specifically, the memory block BLKz may include a plurality of cell strings connected between the bit lines BL1 to BLm and a common source line CSL. The bit lines BL1 to BLm may be respectively connected to the cell strings, and the common source line CSL may be commonly connected to the cell strings. The cell strings may be configured identically to each other, and therefore, a cell string ST connected to a first bit line BL1 will be described in detail as an example.

The cell string may include a source select transistor SST, a plurality of memory cells M1 to Mn, and a drain select transistor DST, which are connected in series to each other between the common source line CSL and the first bit line BL1. At least one source select transistor SST and at least one drain select transistor DST may be included in one cell string, and memory cells of which number is greater than the number of the memory cells M1 to Mn shown in the drawing may be included in the one cell string.

A source of the source select transistor SST may be connected to the common source line CSL, and a drain of the drain select transistor DST may be connected to the first bit line BL1. The memory cells M1 to Mn may be connected in series between the source select transistor SST and the drain select transistor DST. Gates of source select transistors SST included in different cell strings may be connected to the source select line SSL, and gates of drain select transistors DST included in different cell strings may be connected to the drain select line DSL. Gates of the memory cells M1 to Mn may be connected to a plurality of word lines WL1 to WLn. A group of memory cells connected to the same word line among memory cells included in different cell strings may be referred to as a physical page PPG. Therefore, physical pages PPG of which number corresponds to the number of the word lines WL1 to WLn may be included in the memory block BLKz.

Each of a plurality of memory cells included in the arbitrary memory block BLKz may be configured as a Single-Level Cell (SLC) storing one-bit data, a Multi-Level Cell (MLC) storing two-bit data, a Triple-Level Cell (TLC) storing three-bit data, a Quad-Level Cell (QLC) storing four-bit data, or a memory cell storing five-or-more-bit data.

The peripheral circuit 1200 may drive the memory cell array 1100. For example, the peripheral circuit 1200 may drive the memory cell array 1100 to perform a program operation, a read operation, and an erase operation under the control of the control logic 1300. In another example, the peripheral circuit 1200 may apply various operating voltages necessary for an internal operation to the row lines RL and the bit lines BL1 to BLm or discharge the applied voltages under the control of the control logic 1300. For some embodiments, an internal operation may include a program operation or a read operation.

The peripheral circuit 1200 may include the address decoder 1210, a voltage controller 1220, the page buffer circuit 1230, a data input/output circuit 1240, a sensing circuit 1250, and a pass voltage information generator 1260.

The address decoder 1210 may be connected to the memory cell array 1100 through the row lines RL. The row lines RL may include drain select lines, word lines, source select lines, and a common source line.

The address decoder 1210 may be operated under the control of the control logic 1300. The address decoder 1210 may receive an address ADDR from the control logic 1300.

The address decoder 1210 may decode a block address in the received address ADDR. The address decoder 1210 may select at least one memory block among the memory blocks BLK1 to BLKz according to the decoded block address. The address decoder 1210 may decode a row address in the received address ADDR. The address decoder 1210 may 1210 may select at least one word line WL of the selected memory block by applying voltages provided from the voltage controller 1220 to the at least one word line WL according to the decoded row address.

In a read operation, the address decoder 1210 may apply a read voltage to a selected word line, and apply a pass voltage having a level higher than a level of the read voltage to unselected word lines.

In a program operation, the address decoder 1210 may apply a program voltage to the selected word line, and apply a pass voltage having a level lower than a level of the program voltage to unselected word lines. In a program verify operation, the address decoder 1210 may apply a verify voltage to the selected word line, and apply a pass voltage having a level higher than a level of the verify voltage to the unselected word lines.

The address decoder 1210 may decode a column address in the received address ADDR. The decoded column address may be provided to the page buffer circuit 1230.

The voltage controller 1220 may generate a plurality of operating voltages Vop by using an external power voltage supplied to the memory device 1000. The voltage controller 1220 may be operated under the control of the control logic 1300. For example, the voltage controller 1220 may generate various operating voltages Vop used for program, read, and erase operations in response to an operation signal OPSIG provided by the control logic 1300. The voltage controller 1220 may generate a plurality of program voltages, a plurality of pass voltages, a plurality of select read voltages, a plurality of unselect read voltages, and a plurality of erase voltages.

The plurality of generated operating voltages Vop may be supplied to the memory cell array 1100 by the address decoder 1210.

The page buffer circuit 1230 may include first to mth page buffers (not shown). The first to mth page buffers (not shown) may be connected to the memory cell array 1100 respectively through first to mth bit lines BL1 to BLm. The first to mth page buffers (not shown) may be operated under the control of the control logic 1300.

The data input/output circuit 1240 may be connected to the page buffer circuit 1230 through data lines DL. The data input/output circuit 1240 may be operated under the control of the control logic 1300.

In a verify operation, the sensing circuit 1250 may generate a reference current in response to an allow bit VRYBIT generated by the control logic 1300, and output a pass signal P or a fail signal F to the control logic 1300 by comparing a sensing voltage Vpb received from the page buffer circuit 1230 with a reference voltage generated by the reference current. For example, the sensing circuit 1250 may output the pass signal P to the control logic 1300 when a magnitude of the sensing voltage Vpb is greater than a magnitude of the reference voltage. In another example, the sensing circuit 1250 may output the fail signal F to the control logic 1300 when the magnitude of the sensing voltage Vpb is smaller than the magnitude of the reference voltage.

The pass voltage information generator 1260 may generate pass voltage information. The pass voltage information generator 1260 may generate pass voltage information, based on a voltage level Vcsl of the common source line included in the memory cell array 1100. The pass voltage information generator 1260 may provide the generated pass voltage information to the control logic 1300. The pass voltage information may include a clock count COUNT_CLK input during a predetermined period.

The control logic 1300 may be connected to the address decoder 1210, the voltage controller 1220, the page buffer circuit 1230, the data input/output circuit 1240, the sensing circuit 1250, and the pass voltage information generator 1260. The control logic 1300 may control a general operation of the memory device 1000. The control logic 1300 may 1300 may be operated in response to a command CMD provided by the memory controller 200. The control logic 1300 may be implemented as hardware, software, or a combination of hardware and software. For example, the control logic 1300 may be a control logic circuit operating in accordance with an algorithm and/or a processor executing control logic code.

The control logic 1300 may control the peripheral circuit 1200 by generating several signals in response to a command CMD and an address ADDR. For example, the control logic 1300 may generate the operation signal OPSIG, the address ADDR, a page buffer control signal PBSIG, and the allow bit VRYBIT in response to the command CMD and the address ADDR. The control logic 1300 may output the operation signal OPSIG to the voltage controller 1220, output the address ADDR to the address decoder 1210, output the page buffer control signal PBSIG to the page buffer circuit 1230, and output the allow bit VRYBIT to the sensing circuit 1250. Also, the control logic 1300 may determine whether the verify operation has passed or failed in response to the pass or fail signal P/F output by the sensing circuit 1250.

In an embodiment, the control logic 1300 may determine a pass voltage to be applied to the memory cell array 1100, based on pass voltage information provided by the pass voltage information generator 1260. The pass voltage information may include a clock count COUNT_CLK counted during a predetermined period. The control logic 1300 may control the peripheral circuit 1200 to determine a pass voltage, based on the pass voltage information, and to apply the determined pass voltage to the plurality of word lines.

The control logic 1300 may include a pass voltage determiner 131. The pass voltage determiner 131 may determine a pass voltage to be applied to an arbitrary word line, based on a mapping table (not shown) stored therein. Also, the control logic 1300 may apply the determined pass voltage to another word line in a memory block in which the arbitrary word line is included. In an embodiment, it is assumed that a read operation on an Nth page included in a zth memory block BLKz has been performed. The pass voltage information generator 1260 may generate pass voltage information in a process of performing the read operation on the Nth page, and provide the generated pass voltage information to the control logic 1300.

When a read operation on an Mth page included in the zth memory block BLKz is performed, the control logic 1300 may determine a pass voltage, based on the pass voltage information generated in the process of performing the read operation on the Nth page, and apply, to the plurality of word lines, a pass voltage determined when the read operation on the Mth page is performed.

Figure 2:
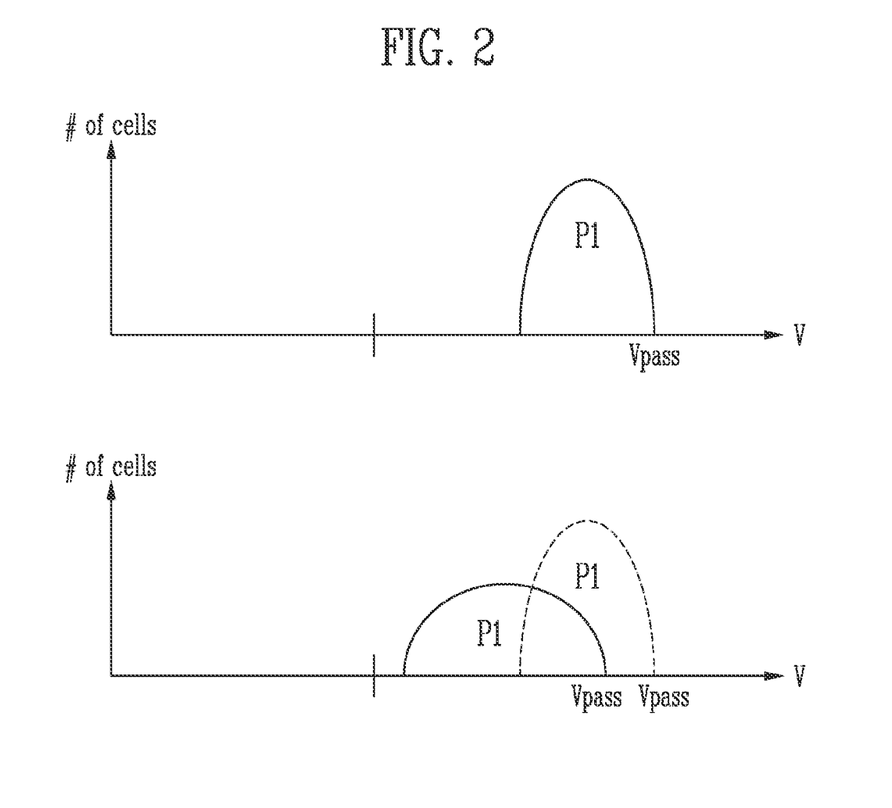
FIG. 2 is a diagram illustrating a pass disturb phenomenon.

FIG. 2 is a diagram illustrating a pass disturb phenomenon.

Referring to FIG. 2, a threshold voltage distribution is illustrated, in which the horizontal axis represents voltage V and the vertical axis represents number of cells.

By a program operation, a threshold voltage of memory cells to which a program voltage is applied may have a threshold voltage corresponding to a first program state P1. In order to turn on all the memory cells having the threshold voltage corresponding to the first program state P1, a voltage having a highest threshold voltage is to be applied to memory cells corresponding to the first program state P1. That is, when a pass voltage Vpass is applied, the memory cells corresponding to the first program state P1 may all be turned on.

However, a threshold voltage distribution of memory cells corresponding to the first program state P1 may be changed according to lapse of time. As illustrated in a lower graph shown in FIG. 2, a threshold voltage distribution of memory cells corresponding to the first program state P1 may be widened as compared with a threshold voltage distribution of memory cells corresponding to the first program state P1, which is illustrated in an upper graph shown in FIG. 2. In addition, a threshold voltage level of the memory cells corresponding to the first program state P1, which is illustrated in the lower graph, may have a threshold voltage lower than a threshold voltage of the memory cells corresponding to the first program state P1, which is illustrated in the upper graph.

Under a situation in which the threshold voltage distribution is changed according to lapse of time as illustrated in the lower graph, a pass voltage Vpass required to turn on all the memory cells corresponding to the first program state P1 may be a value smaller than a value of the pass voltage Vpass illustrated in the upper graph. That is, when the pass voltage before the threshold voltage of the memory cells corresponding to the first program state P1 is changed is applied, even though the threshold voltage of the memory cells corresponding to the first program state P1 has become low, a pass disturb phenomenon may occur as an excessively high pass voltage Vpass is applied. Thus, when a threshold voltage distribution of memory cells is checked, and a pass voltage corresponding to the checked threshold voltage distribution is applied, the pass disturb phenomenon can be reduced.

Figure 3:
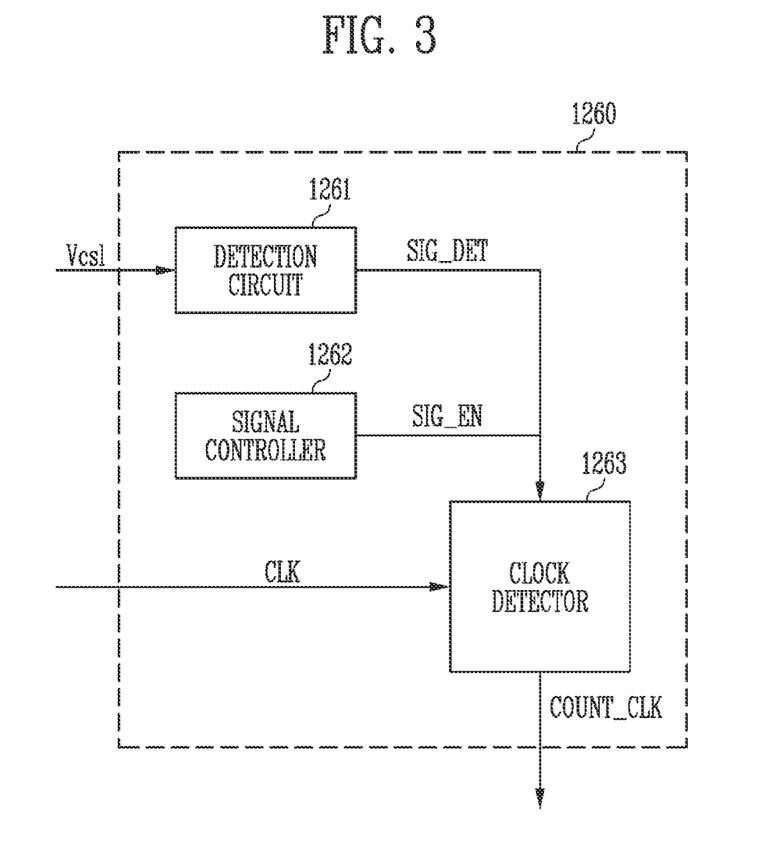
FIG. 3 is a diagram illustrating a pass voltage information generator in accordance with an embodiment of the present disclosure.

FIG. 3 is a diagram illustrating a pass voltage information generator in accordance with an embodiment of the present disclosure.

Referring to FIG. 3, the pass voltage information generator 1260 may include a detection circuit 1261, a signal controller 1262, and a clock detector 1263.

The detection circuit 1261 may output a detection signal SIG_DET to the clock detector 1263, based on a voltage level of the common source line CSL included in the memory block shown in FIG. 1. When the voltage level of the common source line CSL reaches a predetermined reference level, the detection circuit 1261 may output the detection signal SIG_DET in a logic high state. On the contrary, when the voltage level of the common source line CSL does not reach the predetermined reference level, the detection circuit 1261 may output the detection signal SIG_DET in a logic low state.

The signal controller 1262 may output, to the clock detector 1263, an enable signal SIG_EN representing whether a voltage is applied to the word lines WL1 to WLn included in the memory block shown in FIG. 1. When a pass voltage is applied to the word lines WL1 to WLn, the signal controller 1262 may output the enable signal SIG_EN in a logic high state. On the contrary, when the pass voltage is not applied to the word lines WL1 to WLn, the signal controller 1262 may output the enable signal SIG_EN in a logic low state.

In an embodiment, when the voltage controller 1220 shown in FIG. 1 provides an operating voltage Vop to the address decoder 1210, the signal controller 1262 may output the enable signal SIG_EN in the logic high state. In another embodiment, when the address decoder 1210 shown in FIG. 1 applies the pass voltage to the word lines WL1 to WLn, the signal controller 1262 may output the enable signal SIG_EN in the logic high state.

The clock detector 1263 may generate pass voltage information, based on a clock CLK provided by the memory controller 200 shown in FIG. 1, the detection signal SIG_DET provided by the detection circuit 1261, and the enable signal SIG_EN provided by the signal controller 1262. The pass voltage information may include information on a number of clocks input during a specific period.

The clock detector 1263 may determine a specific period in which the clock CLK provided by the memory controller 200 shown in FIG. 1 is to be counted, based on the detection signal SIG_DET and the enable signal SIG_EN.

In an embodiment, the clock detector 1263 may count a number of clocks input during a period in which the enable signal SIG_EN in the logic high state and the detection signal SIG_DET in the logic low state are simultaneously input.

The clock detector 1263 may provide the pass voltage information to the control logic 1300 shown in FIG. 1.

Figure 4:
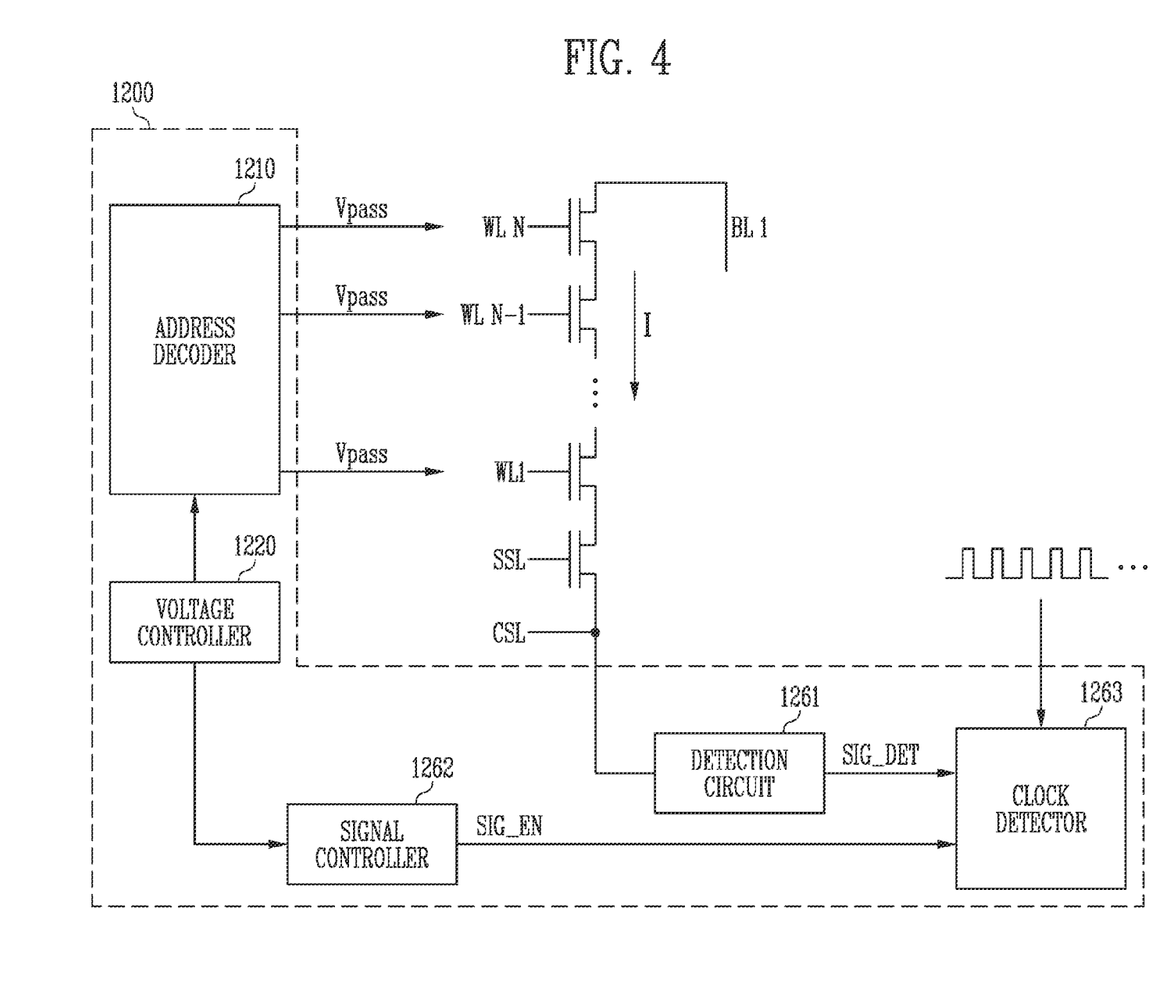
FIG. 4 is a diagram illustrating an operation of the pass voltage information generator in accordance with an embodiment of the present disclosure.

FIG. 4 is a diagram illustrating an operation of the pass voltage information generator in accordance with an embodiment of the present disclosure.

Referring to FIG. 4, the detection circuit 1261 may detect a voltage of the common source line CSL, based on a current flowing through a cell string connected between an arbitrary bit line BL1 and the common source line CSL.

In order to generate pass voltage information, the peripheral circuit 1200 may apply a pass voltage Vpass to all word lines. The pass voltage Vpass may be a voltage having a level enough to turn on memory cells connected to each of the word lines.

In an embodiment, the pass voltage Vpass may be simultaneously applied to first to Nth word lines WL1 to WLN. Memory cells connected to each of the word lines WL1 to WLN may be turned on as the pass voltage applied to the word lines WL1 to WLN increases. When the memory cells connected to the cell string connected between the common source line CSL and the bit line BL1 are turned on, a current I may flow in a direction toward the common source line CSL from the bit line BL1.

When the current starts flowing in the direction toward the common source line CSL from the bit line BL1, the voltage level of the common source line CSL may increase. That is, although the common source line CSL is connected to a ground level, the voltage level of the common source line CSL may increase due to the current flowing through the cell string. Such a phenomenon is referred to as a source line bouncing phenomenon.

When the voltage level of the common source line CSL increases, the detection circuit 1261 may monitor whether the voltage level of the common source line CSL has exceeded the predetermined reference level. The predetermined reference level may be a half of a maximum value of the voltage of the common source line CSL, which increases due to the source line bouncing phenomenon. However, the reference level is merely illustrative, and is not limited to the embodiment of the present disclosure.

In an embodiment, when the voltage level of the common source line CSL exceeds the predetermined reference level, the detection circuit 1261 may provide the detection signal SIG_DET in the logic high state to the clock detector 1263.

When the pass voltage is applied to the word lines WL1 to WLN shown in FIG. 4, the signal controller 1262 may provide the enable signal SIG_EN in the logic high state to the clock detector 1263.

Figure 5:
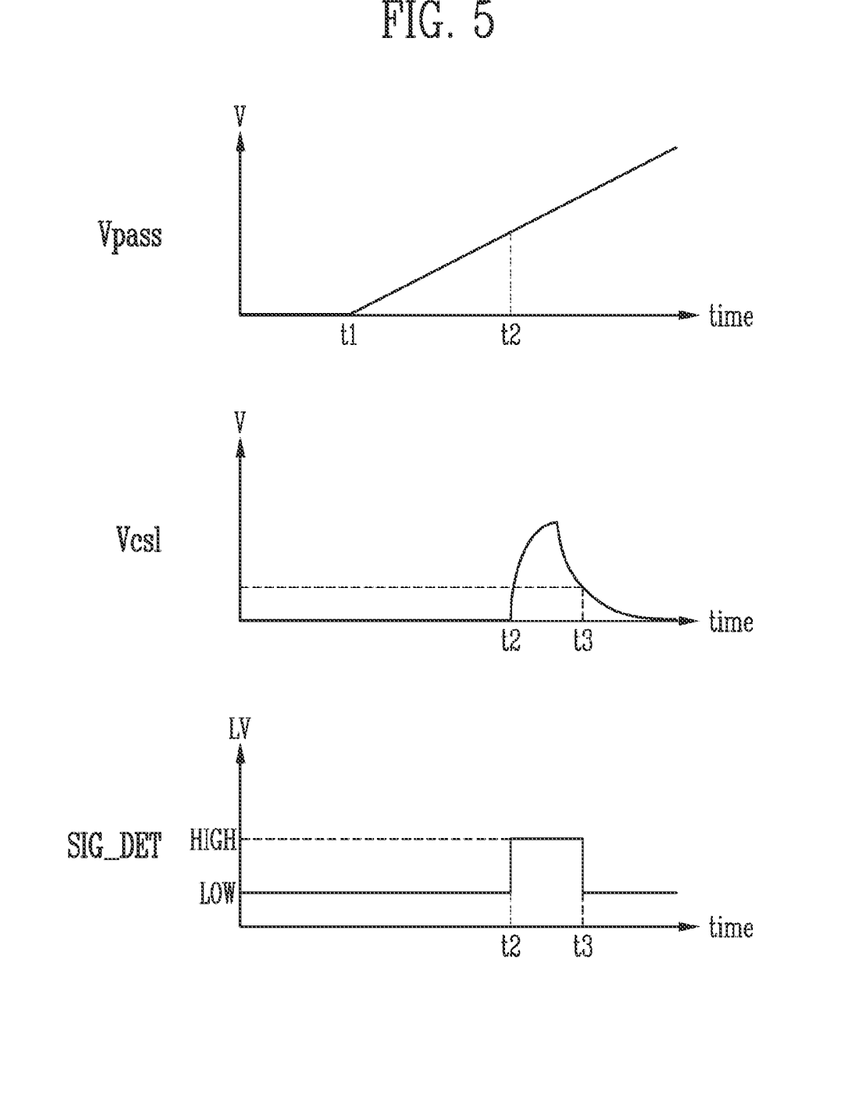
FIG. 5 is a diagram illustrating an operation of a detection circuit in accordance with an embodiment of the present disclosure.

FIG. 5 is a diagram illustrating an operation of the detection circuit in accordance with an embodiment of the present disclosure.

Referring to FIG. 5, the pass voltage is applied to all the word lines from time t1.

From the time t1, the pass voltage Vpass is applied to all the word lines. The pass voltage Vpass applied to all the word line may have a value gradually increasing according to lapse of time.

In an embodiment, because the pass voltage Vpass is applied to all the word lines from the time t1, the memory cells connected to all the word lines may be in a turn-off state. That is, because there is no cell current flow from the bit line to the common source line CSL, the voltage level Vcsl of the common source line CSL may maintain a ground voltage.

In an embodiment, because the voltage level Vcsl of the common source line CSL maintains a ground voltage level, the detection circuit 1261 may output the detection signal SIG_DET in the logic low state.

At time t2, as the memory cells connected to all the word lines are turned on, a cell current may flow from the bit line to the common source line CSL. At the time t2, a current may flow in the direction toward the common source line CSL from the bit line through the memory cells connected to the cell string. Therefore, at the time t2, the voltage level Vcsl of the common source line CSL may rapidly increase due to the source line bouncing phenomenon.

As the voltage level Vcsl of the common source line CSL rapidly increases, the voltage level Vcsl of the common source line CSL may reach the predetermined reference level. The detection circuit 1261 may monitor the voltage level of the common source line CSL, and check whether the voltage level of the common source line CSL has reached the predetermined reference level.

In an embodiment, the detection circuit 1261 may output the detection signal SIG_DET in the logic high state from the time t2 at which the voltage level of the common source line CSL reaches the predetermined reference level to time t3 at which the voltage level of the common source line CSL again reaches the predetermined reference level.

At the time t3, the voltage level of the common source line CSL may become lower than the predetermined reference level. The detection circuit 1261 may output the detection signal SIG_DET in the logic low state from the time t3.

Figure 6:
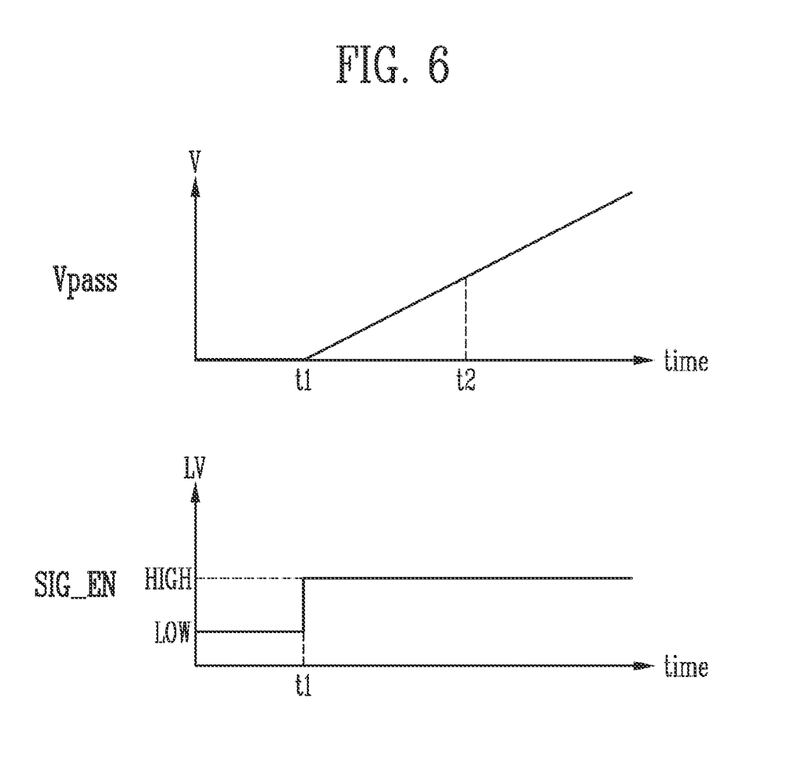
FIG. 6 is a diagram illustrating an operation of a signal controller in accordance with an embodiment of the present disclosure.

FIG. 6 is a diagram illustrating an operation of the signal controller in accordance with an embodiment of the present disclosure.

The pass voltage Vpass is applied to all the word lines from time t1. The pass voltage Vpass applied to all the word lines may have a value gradually increasing according to lapse of time.

The signal controller 1262 shown in FIG. 4 may output an enable signal representing whether the pass voltage is applied to all the word lines.

In an embodiment, the signal controller 1262 may output the enable signal SIG_EN in the logic high state from the time t1 at which the pass voltage is applied to all the word lines. On the contrary, the signal controller 1262 may output the enable signal SIG_EN in the logic low state in a period before the time t1, in which the pass voltage is not applied to all the word lines.

Figure 7:
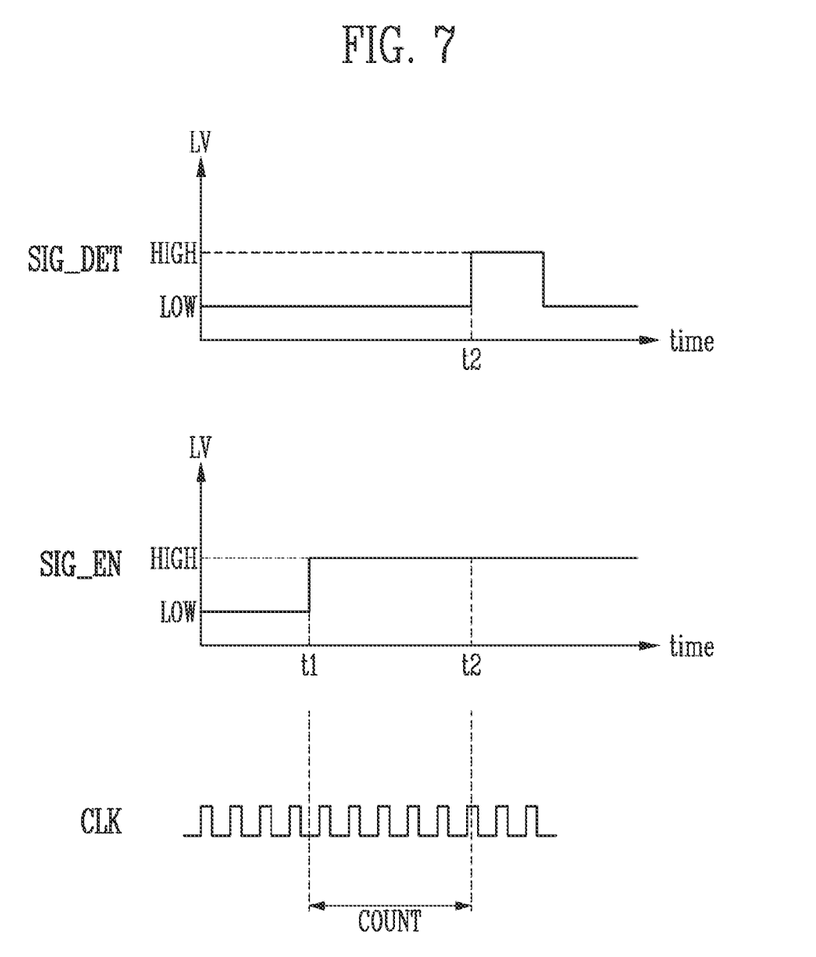
FIG. 7 is a diagram illustrating an operation of a clock detector in accordance with an embodiment of the present disclosure.

FIG. 7 is a diagram illustrating an operation of the clock detector in accordance with an embodiment of the present disclosure.

As described above with reference to FIGS. 5 and 6, in an embodiment, a time at which the pass voltage Vpass is applied to all the word lines is time t1, and a time at which the voltage level of the common source line CSL increases due to the source line bouncing phenomenon is time t2.

The clock detector 1263 shown in FIG. 4 may count a number of clocks input during a specific period. The specific period may be a period from a time at which the pass voltage Vpass is applied to all the word lines to a time at which the voltage level of the common source line CSL reaches the predetermined reference level. In other words, the clock detector 1263 may count a number of clocks while the enable signal SIG_EN in the logic high state and the detection signal SIG_DET in the logic low state are input, and suspend a count operation when the enable signal SIG_EN in the logic high state and the detection signal SIG_DET in the logic high state are input.

In an embodiment, the clock detector 1263 may count a number of clocks input from the time t1 at which the enable signal SIG_EN in the logic high state and the detection signal SIG_DET in the logic low state are input to the time t2 at which the enable signal SIG_EN in the logic high state and the detection signal SIG_DET in the logic high state are input.

In an embodiment, the clock detector 1263 may generate pass voltage information including information on the number of five clocks counted during a clock count period t1 to t2.

Figure 8:
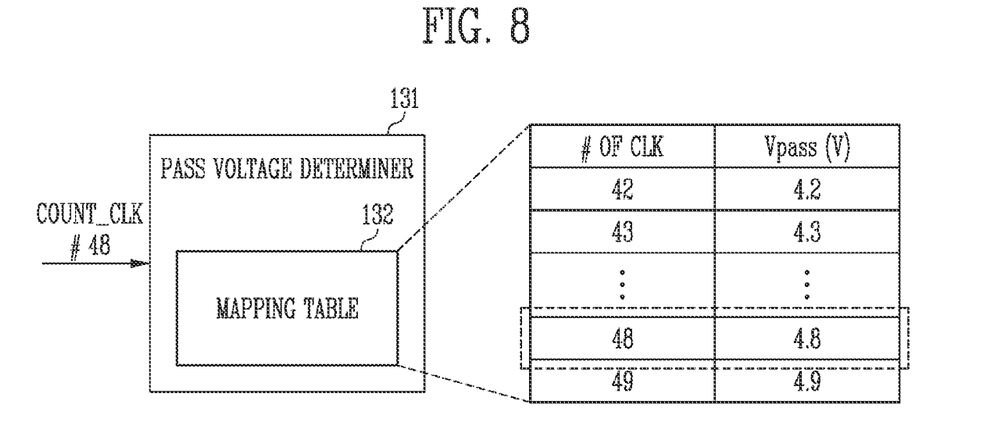
FIG. 8 is a diagram illustrating a mapping table in accordance with an embodiment of the present disclosure.

FIG. 8 is a diagram illustrating a mapping table in accordance with an embodiment of the present disclosure.

Referring to FIG. 8, the mapping table 132 may include pass voltage values respectively corresponding to numbers of clocks.

The pass voltage determiner 131 may determine a pass voltage to be applied, based on pass voltage information provided by the clock detector 1263 shown in FIG. 3. The pass voltage information provided by the clock detector 1263 may include information on a number of clocks. The pass voltage determiner 131 may determine a pass voltage corresponding to the pass voltage information, based on the mapping table 132.

The pass voltage stored in the mapping table 132 may increase in proportion to the number of clocks. For example, when the number of clocks counted from the time at which the pass voltage Vpass is applied to all the word lines to the time at which the voltage level of the common source line CSL reaches the predetermined reference level is 42, the pass voltage determiner 131 may determine the pass voltage as 4.2 V. In another example, when the number of clocks counted from the time at which the pass voltage Vpass is applied to all the word lines to the time at which the voltage level of the common source line CSL reaches the predetermined reference level is 43, the pass voltage determiner 131 may determine the pass voltage as 4.3 V. In still another example, when the number of clocks counted from the time at which the pass voltage Vpass is applied to all the word lines to the time at which the voltage level of the common source line CSL reaches the predetermined reference level is 48, the pass voltage determiner 131 may determine the pass voltage as 4.8 V. In still another example, when the number of clocks counted from the time at which the pass voltage Vpass is applied to all the word lines to the time at which the voltage level of the common source line CSL reaches the predetermined reference level is 49, the pass voltage determiner 131 may determine the pass voltage as 4.9 V.

The pass voltage determiner 131 may provide the operation signal OPSIG to the voltage controller 1220 shown in FIG. 2 to apply the determined pass voltage to the word lines. The voltage controller 1220 may 1220 may apply the determined pass voltage to unselected word lines in response to the operation signal OPSIG.

Figure 9:
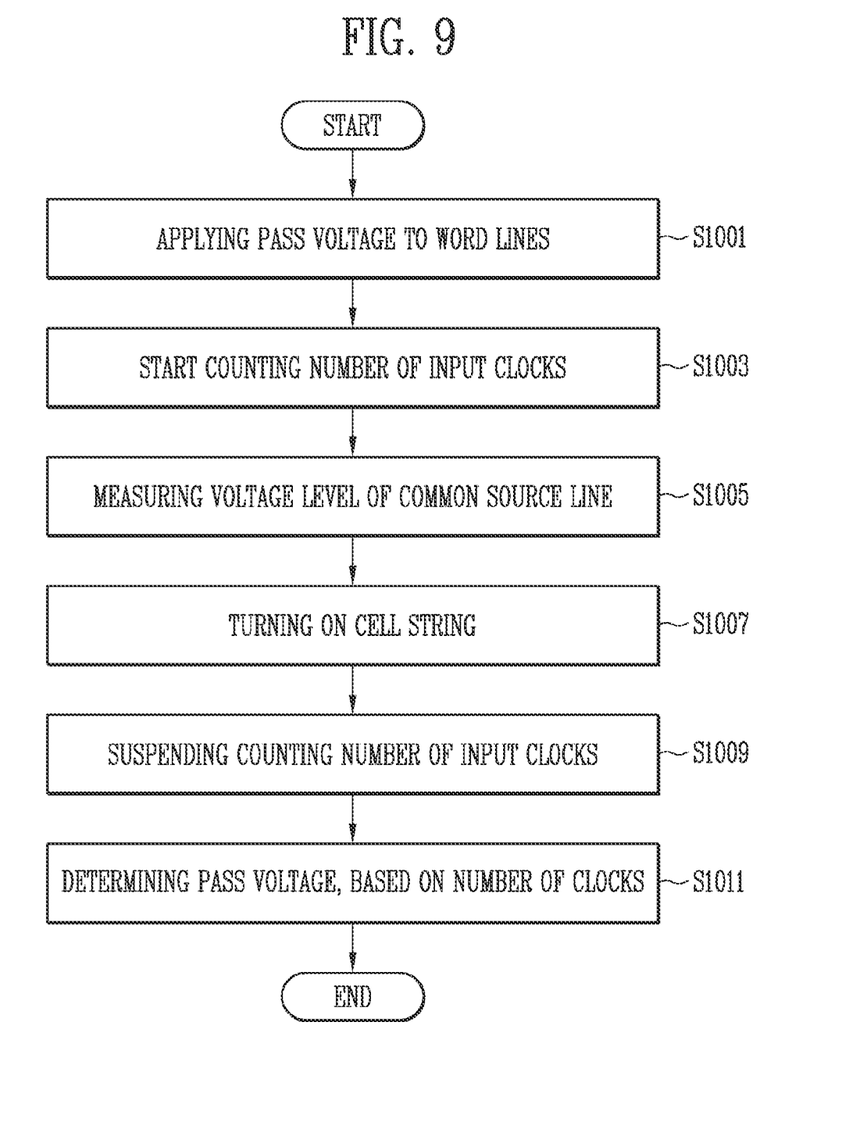
FIG. 9 is a flowchart illustrating an operation of a memory device in accordance with an embodiment of the present disclosure.

FIG. 9 is a flowchart illustrating an operation of the memory device in accordance with an embodiment of the present disclosure.

In step S1001, a pass voltage is applied to all word lines. The pass voltage may have a voltage level enough to turn on memory cells connected to all the word lines.

In step S1003, the memory device may count a number of clocks provided by the memory controller. The memory device may count a number of clocks input from a time at which the pass voltage is applied to all the word lines.

In step S1005, the memory device may measure a voltage level of a common source line. When the voltage level of the common source line reaches a predetermined reference level, the memory device may output a detection signal in a logic high level.

In step S1007, a cell string is turned on. That is, the memory cells connected to all the word lines are turned on. When the cell string is turned on, a current may flow in a direction toward the common source line from a bit line. The voltage level of the common source line may increase by means of a current flowing through the cell string.

In step S1009, the memory device may suspend an operation of counting a number of clocks provided by the memory controller.

In step S1011, the memory device may determine a pass voltage to be applied, based on the counted number of clocks. The memory device may determine the pass voltage, based on a mapping table including information on a pass voltage corresponding to the counted number of clock. A level of the pass voltage may increase in proportion to the number of clock.

In the electronic device in accordance with the present disclosure, pass disturb can be reduced.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all or some of the steps may be selectively performed in the presented or an alternate order. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a memory cell array including a cell string including a plurality of memory cells respectively connected between a common source line and a plurality of bit lines;
   a peripheral circuit configured to perform an internal operation on the memory cells; and
   control logic configured to control the peripheral circuit to apply a voltage necessary for the internal operation to word lines connected to the plurality of memory cells,
   wherein the peripheral circuit includes a pass voltage information generator configured to generate pass voltage information including a number of clocks input from a time at which a pass voltage is applied to the word lines to a time at which a voltage level of the common source line reaches a predetermined reference level, and
   wherein the control logic includes a pass voltage determiner configured to determine a pass voltage to be applied to the word lines, based on the pass voltage information.

2. The memory device of claim 1, wherein the pass voltage information generator includes:
   a voltage controller configured to apply a voltage necessary for the internal operation to the word line;
   a detection circuit configured to detect the voltage level of the common source line, and to output a detection signal representing whether the voltage level of the common source line has reached the predetermined reference level;
   a signal controller configured to output an enable signal representing whether the pass voltage is applied to the word lines; and
   a clock detector configured to count the number of clocks input from a time at which the pass voltage is applied to the word lines to a time at which the voltage level of the common source line reaches the predetermined reference level.

3. The memory device of claim 2, wherein the detection circuit is configured to output a detection signal in a logic high state when the voltage level of the common source line reaches the predetermined reference level.

4. The memory device of claim 3, wherein the voltage level of the common source line increases by means of a current flowing through a cell string connected to the common source line.

5. The memory device of claim 2, wherein the signal controller is configured to output an enable signal in a logic high state when the pass voltage is applied to the word lines.

6. The memory device of claim 2, wherein the pass voltage determiner includes a mapping table to store a pass voltage value corresponding to the number of input clocks.

7. The memory device of claim 6, wherein the pass voltage value has a value increasing in proportion to the number of input clocks.

8. The memory device of claim 6, wherein the pass voltage determiner is configured to determine a pass voltage value corresponding to a clock count number provided by the clock detector, and to provide the determined pass voltage value to the voltage controller.

9. The memory device of claim 8, wherein the pass voltage determiner is configured to, when a read operation on another page included in the same memory block as a page read when the pass voltage value is determined is performed, determine the pass voltage to be applied to the word lines, based on the determined pass voltage value.

10. The memory device of claim 1, wherein the internal operation is any one of a program operation and a read operation.

11. A method of operating a memory device, the method comprising:
    applying a pass voltage to a plurality of word lines;
    monitoring a voltage level of a common source line;
    counting a number of clocks input from a time at which the pass voltage is applied to the plurality of word lines to a time at which the voltage level of the common source line reaches a predetermined reference level; and
    determining a pass voltage to be applied to the plurality of word lines, based on the counted number of clocks.

12. The method of claim 11, wherein monitoring the voltage level of the common source line includes outputting a detection signal in a logic high state, when the voltage level of the common source line reaches the predetermined reference level.

13. The method of claim 12, wherein counting the number of clocks is ended in response to the detection signal in the logic high state.

14. The method of claim 11, wherein determining the pass voltage comprises determining a pass voltage corresponding to the counted number of clocks, based on a mapping table which stores a pass voltage corresponding to a number of clocks.

15. The method of claim 14, wherein the mapping table stores a pass voltage value increasing in proportion to the counted number of clocks.

\* \* \* \* \*